United States Patent [19]

Schrader

[11] Patent Number: 4,868,870
[45] Date of Patent: Sep. 19, 1989

[54] SERVO-CONTROLLED AMPLIFIER AND METHOD FOR COMPENSATING FOR TRANSDUCER NONLINEARITIES

[76] Inventor: Daniel J. Schrader, 3846 Briarcrest, San Antonio, Tex. 78247

[21] Appl. No.: 177,865

[22] Filed: Mar. 23, 1988

Related U.S. Application Data

[63] Continuation of Ser. No. 782,699, Oct. 1, 1985, abandoned.

[51] Int. Cl.$^4$ ............................................. H04R 3/00
[52] U.S. Cl. .................................................... 381/96
[58] Field of Search ............................ 381/59, 96, 103

[56] References Cited

U.S. PATENT DOCUMENTS

| | | | |
|---|---|---|---|
| 2,948,778 | 8/1960 | Clements | 381/96 |
| 3,798,374 | 3/1974 | Meyers | 381/103 |
| 3,872,247 | 3/1975 | Saville et al. | 381/96 |
| 3,889,060 | 6/1975 | Goto | 381/96 |
| 4,176,305 | 11/1979 | Cuno | 318/653 |
| 4,316,060 | 2/1982 | Adams | 381/98 |
| 4,327,250 | 4/1982 | von Recklinghausen | 381/103 |
| 4,340,780 | 7/1982 | Odlen | 381/103 |
| 4,395,588 | 7/1983 | Franssen | 381/96 |
| 4,455,675 | 6/1984 | Bose et al. | 381/96 |
| 4,550,430 | 10/1985 | Meyers | 381/194 |
| 4,598,417 | 7/1986 | Deno | 381/121 |
| 4,609,784 | 9/1986 | Miller | 381/195 |

FOREIGN PATENT DOCUMENTS

| | | | |
|---|---|---|---|
| 879560 | 6/1953 | Fed. Rep. of Germany | 381/96 |
| 2413009 | 8/1979 | France | 381/59 |
| 57-199396 | 12/1982 | Japan | 381/96 |
| 1585759 | 3/1981 | United Kingdom | 381/96 |

OTHER PUBLICATIONS

National Semiconductor, LB-8-1, Aug. 1969, "Precision AC/DC Converters".
Lancaster, Active Filter Cookbook, 1979, p. 204.

*Primary Examiner*—Forester W. Isen
*Attorney, Agent, or Firm*—Kenyon & Kenyon

[57] ABSTRACT

An amplifier arrangement for reducing nonlinearities in the response of an output transducer coupled to the amplifier arrangement is disclosed. The arrangement comprises a sensor coupled to a moving member of the transducer, a precision rectifier circuit having a signal to be amplified and an output signal from the sensor as inputs for comparing the signal to be amplified and the sensor output signal and for producing an error signal proportional to the difference between the two signals and a voltage controlled amplifier for amplifying the signal to be amplified whose gain is controlled by the error signal.

24 Claims, 6 Drawing Sheets

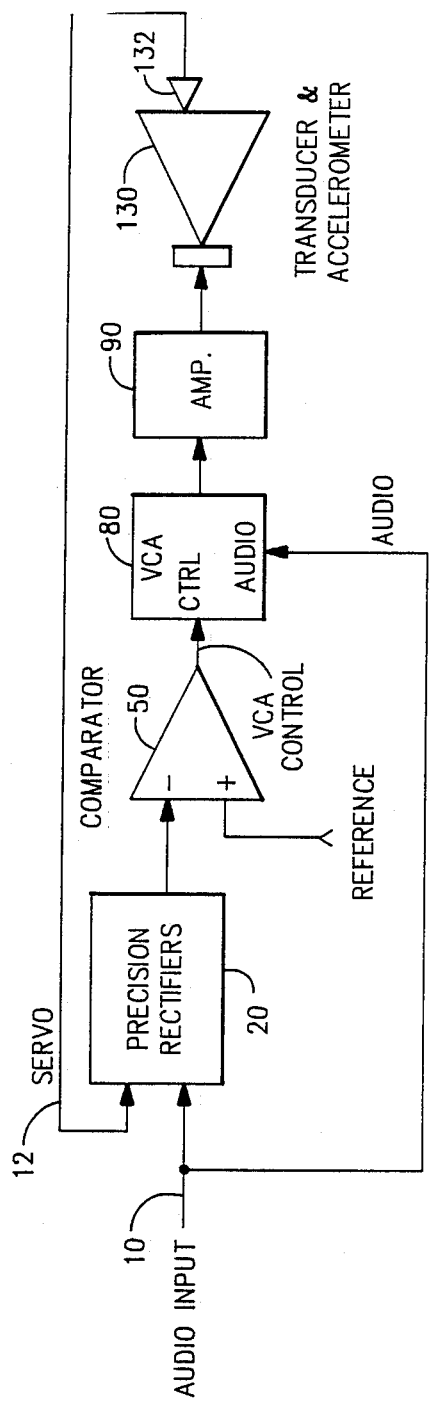
FIG.1
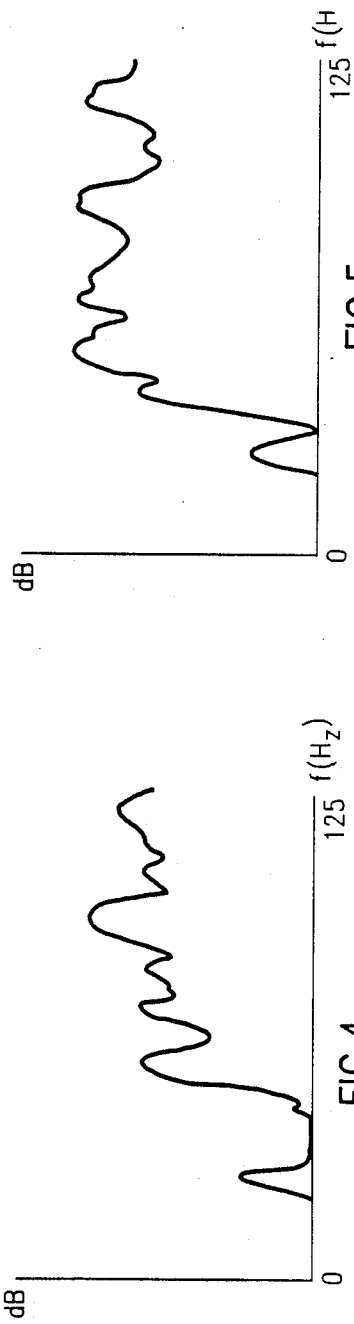
FIG.4
FIG.5

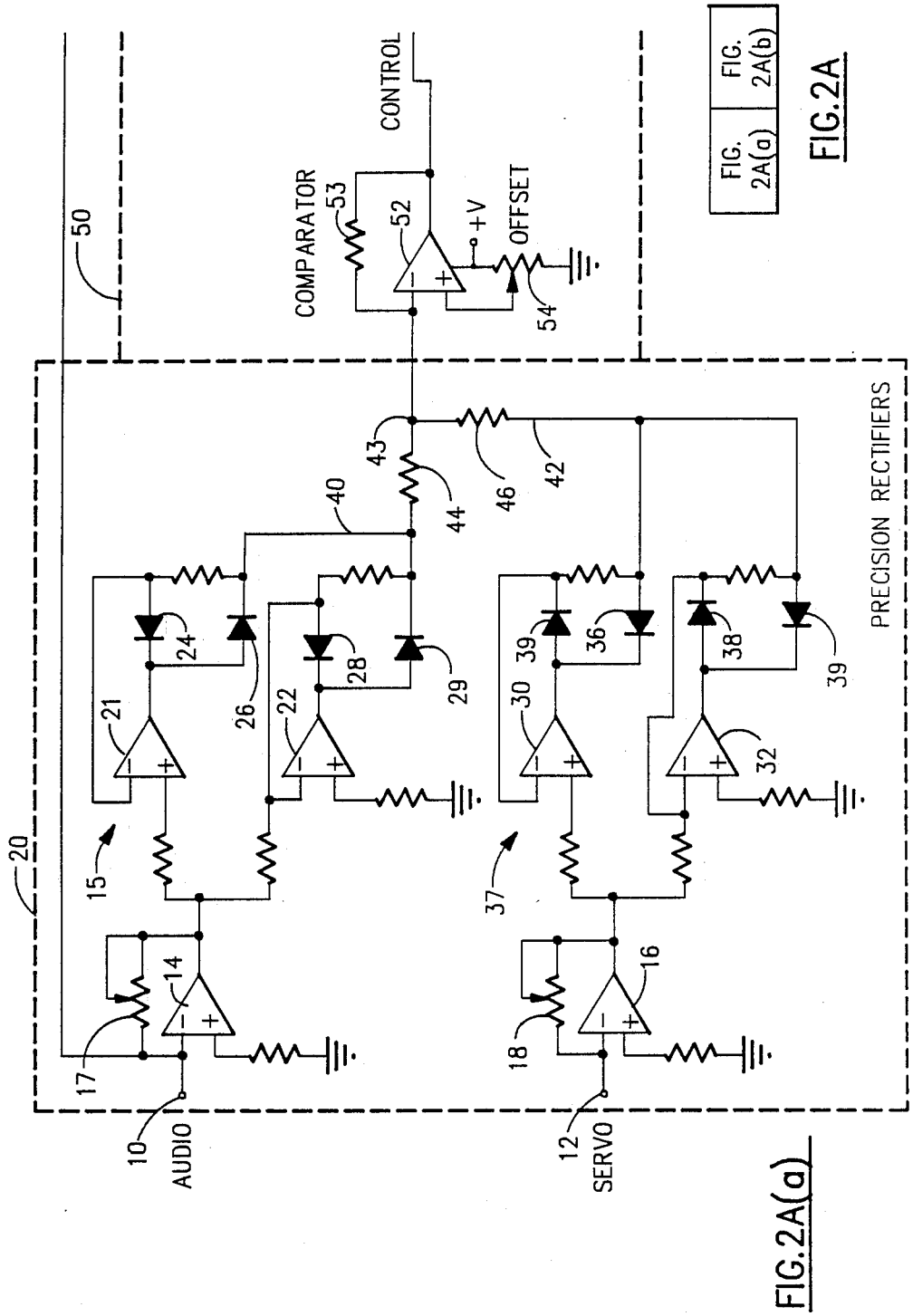

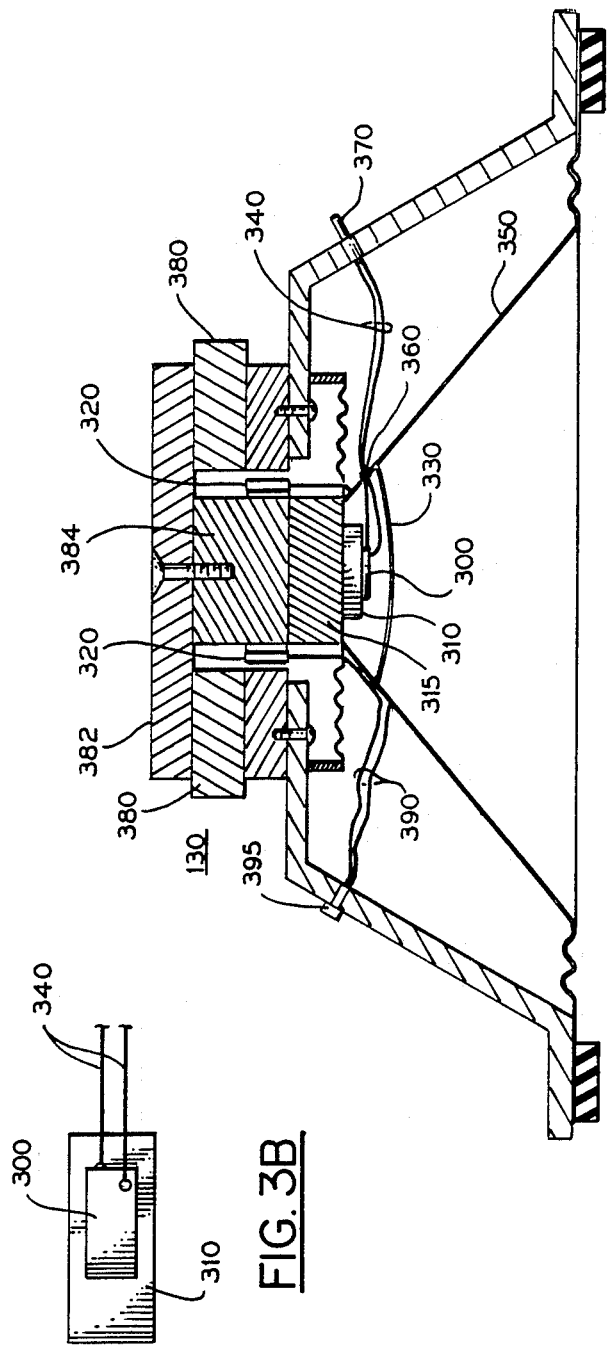
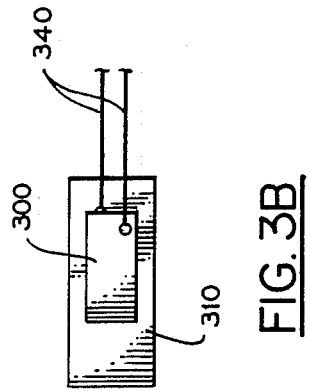
FIG. 3A
FIG. 3B

SERVO-CONTROLLED AMPLIFIER AND METHOD FOR COMPENSATING FOR TRANSDUCER NONLINEARITIES

This application is a continuation of application Ser. No. 782,699, filed 10/1/85 now abandoned.

BACKGROUND OF THE INVENTION

The present invention relates to amplifiers and, in particular, to amplifiers wherein nonlinearities of an output transducer coupled to the amplifier are controlled and compensated. More particularly, the present invention relates to an amplifier arrangement having a control circuit fed by a servo mechanism disposed on the output transducer coupled to the amplifier, thereby controlling and correcting nonlinearities in the response generated by the transducer. For example, the present invention has particular application to the control of nonlinearities generated by loudspeakers coupled to audio amplifiers.

Current audio reproduction is achieved through a system of amplification and reproduction in which the amplifier increases both voltage and current levels, while a transducer produces acoustic output by conversion of electrical energy into acoustic energy. Often the transducer, i.e., a loudspeaker, does not follow its input in linear fashion, resulting in phase, frequency, amplitude and harmonic distortion. Presently, no commercially available amplifier system has been designed to cope with transducer nonlinearities extensively through detection and correction of these nonlinearities.

SUMMARY OF THE INVENTION

It is an object of the present invention to provide an amplifier arrangement which corrects amplifier gain to offset nonlinearities of the transducer coupled to the amplifier.

It is a further object of the present invention to provide an amplifier arrangement which limits amplifier distortion and transducer damage.

It is a further object of the present invention to provide an amplifier arrangement which provides improved transient response, dynamic damping, and flattening of the response curve of the audio amplifier arrangement.

It is yet still a further object of the present invention to provide an audio amplifier arrangement having a feedback loop fed by a sensor disposed on the output transducer coupled to the amplifier, whereby nonlinearities in the response of the transducer can be offset by appropriate control of the amplifier arrangement by signals from the sensor.

These and other objects of the present invention are achieved by an amplifier arrangement for reducing nonlinearities in the response of an output transducer coupled to the amplifier arrangement comprising first means, having as inputs a first signal to be coupled to the transducer after amplification and an output signal of sensor means adapted to be coupled to a moving member of the output transducer, the sensor means providing a signal related to the movement of the moving member, the first means comparing the first signal and the sensor output signal and producing an error signal proportional to the difference between the first and error signals, and amplifier means coupled to the first means for amplifying the first signal, the gain of the amplifier means being controlled by the error signal.

According to another aspect of the present invention, the above objects are achieved by an amplifier arrangement for reducing nonlinearities in the response of an output transducer coupled to the amplifier arrangement comprising sensor means adapted to be coupled to a moving member of the output transducer for providing a signal related to the movement of the moving member, first means, having as inputs a first signal to be coupled to the transducer after amplification and an output signal of the sensor means for comparing the first signal and the sensor output signal and for producing an error signal proportional to the difference between the first and sensor output signals, and amplifier means coupled to the first means for amplifying the first signal, the gain of the amplifier means being controlled by the error signal.

According to a further aspect of the present invention, the above objects are achieved by a transducer adapted to be coupled to the output of an amplifier arrangement, the amplifier arrangement having means for reducing nonlinearities in the response of the transducer, said transducer comprising first means for generating an acoustic signal from a signal supplied to the first means by the amplifier arrangement, and second means coupled to a moving member of the first means for providing a signal to the amplifier arrangement related to the movement of the moving member, the signal being used by the amplifier arrangement to reduce nonlinearities in the response of the first means.

A method for reducing nonlinearities in the response of an output transducer coupled to an amplifier arrangement is also within the scope of the invention.

Other objects, advantages and features of the present invention will be apparent from the detailed description which follows.

BRIEF DESCRIPTION OF THE DRAWINGS

The present invention will be described in the following detailed description with reference to the drawings in which:

FIG. 1 is a block diagram of one embodiment of the servo-controlled amplifier according to the present invention;

FIG. 3A shows how the sensor for detecting transducer position is disposed on the output transducer, the output transducer being shown in a side sectional view;

FIG. 38 is a top view of the sensor of FIG. 3A;

FIG. 4 is a graph of the response of a conventionally driven subwoofer at low frequencies; and FIG. 5 is a graph of the response of a subwoofer driven by the servo amplifier of the present invention at low frequencies.

DETAILED DESCRIPTION

Figure 2A:
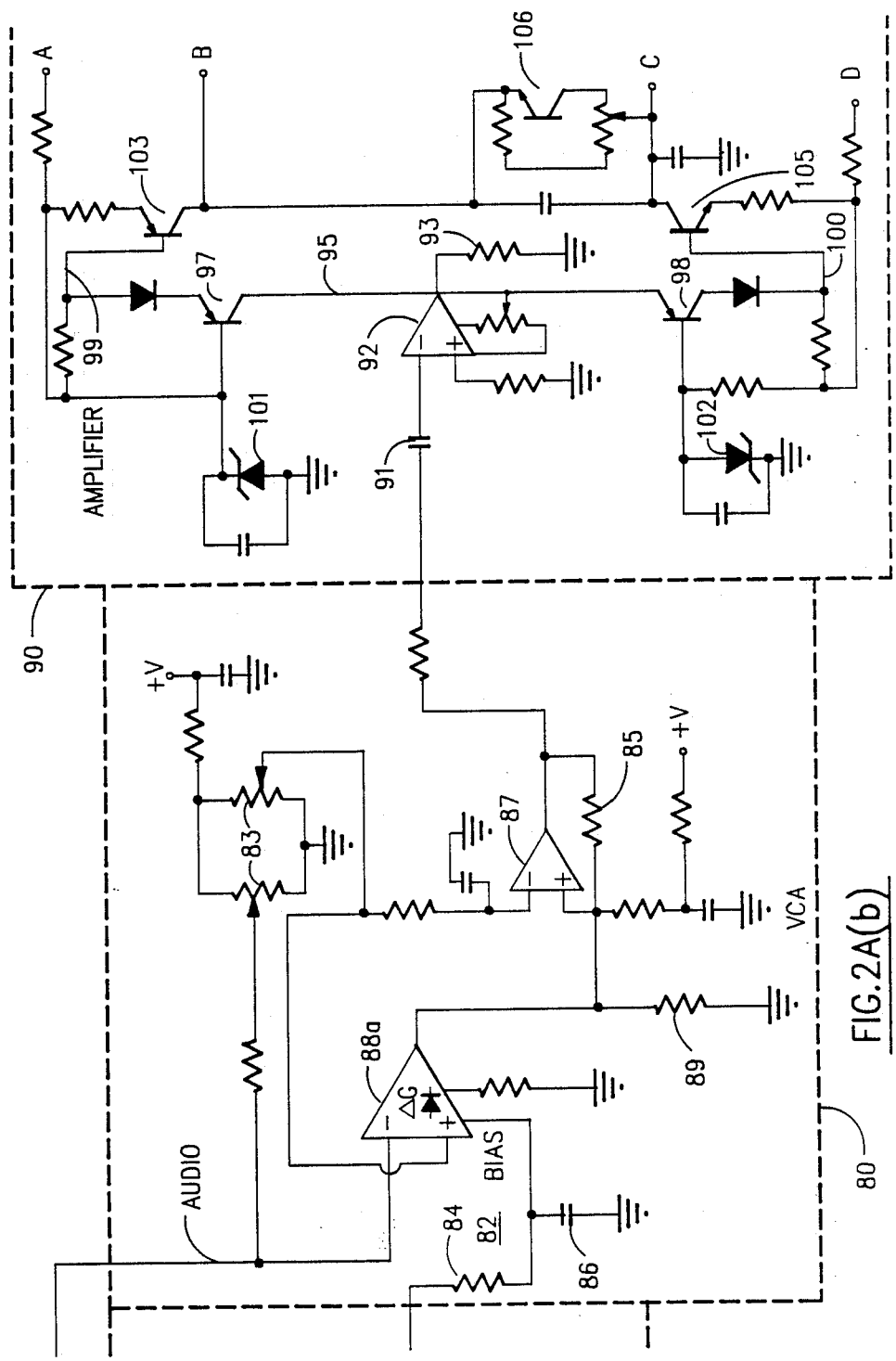
FIGS. 2A and 2B, taken together, show the schematic diagram of one embodiment of the servo-controlled amplifier according to the present invention.

With reference now to the drawings, FIG. 1 shows the block diagram of one embodiment of the servo-controlled audio amplifier according to the present invention. As shown, the servo-controlled audio amplifier arrangement comprises an audio input 10 coupled to a precision rectifier circuit 20, the output of which is coupled to a comparator 50. The output 12 from a servo sensor, for example an accelerometer 132 mounted on the output transducer 130, is fed to another input of the precision rectifier circuit 20. Sensor 132 provides a signal proportional to the movement of a moving member of the transducer, i.e., the voice coil of loudspeaker 130, and in particular, the acceleration of the voice coil. In the precision rectifier circuit 20, both the audio input signal and the servo signal 12 from accelerometer 132 are full wave rectified and a signal produced at the output thereof proportional to the difference between the audio input signal and the servo signal from accelerometer 132. Accordingly, precision rectifier circuit 20 converts both the servo input signal and the audio input signal to pulsating d.c. signals. A signal proportional to the difference between these d.c. signals is a control signal which is fed to comparator 50 wherein the control signal is compared to a fixed reference value. The output of comparator 50 is then fed as an error or control signal to the control input of a voltage controlled amplifier 80, the audio input of which is coupled to the audio input signal 10. The gain of voltage controlled amplifier 80 preferably is centered by amplifier bias voltage. The control signal from comparator 50 drives the gain of the voltage controlled amplifier in a direction so as to reduce the error, thereby correcting amplifier gain to offset transducer nonlinearities. Accordingly, if accelerometer 132 produces a signal whose magnitude, after any gain adjustment, is greater than the magnitude of the audio input signal 10, as determined by the output of precision rectifier circuit 20, comparator 50 will produce an output signal to decrease the gain of voltage controlled amplifier 80, thereby offsetting the transducer nonlinearity. Similarly, if the adjusted magnitude of servo signal 12 is less than the magnitude of audio input signal 10, comparator 50 will produce an output signal to increase the gain of amplifier 80. Maximum control voltages preferably are limited to prevent amplifier distortion and transducer damage under adverse conditions. The result is improved transient response, dynamic damping and flattening of the response curve.

Amplifier 90 may be either a conventional analog amplifier or a digital amplifier, since the closed loop design of the amplifier arrangement shown in FIG. 1 allows the amplifier to correct itself for nonlinearities present at the transducer. As a result, the amplifier performance parameters may be optimized for the particular application, achieving higher performance levels than are typical of amplifiers designed as wide bandwidth devices.

Figure 2B:
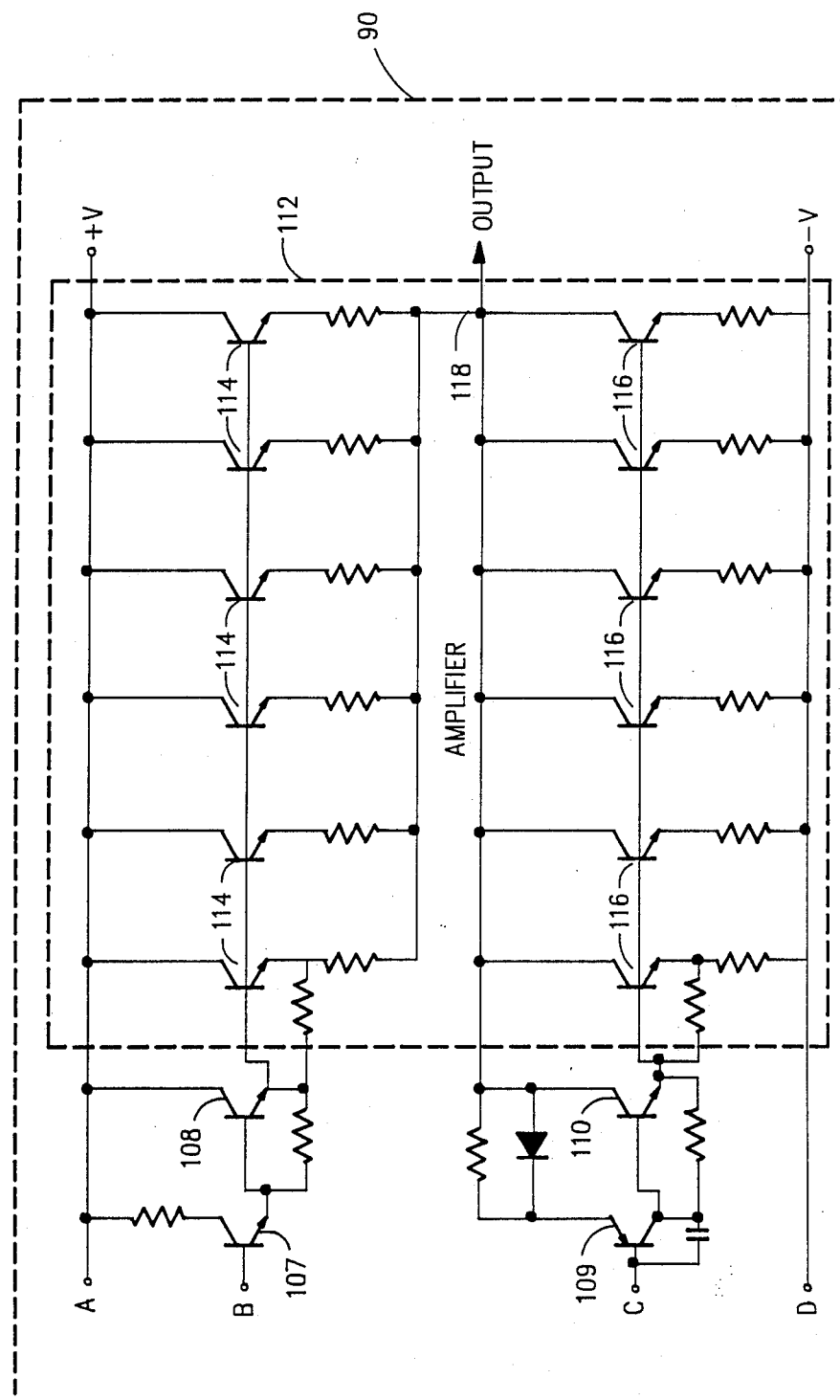

FIGS. 2A and 2B show a schematic diagram for one embodiment of the servo-controlled amplifier according to the invention. Both audio input signal 10 and servo control signal 12 are coupled to the precision rectifier circuit 20. Precision rectifier circuit 20 includes operational amplifiers 14 and 16 which provide gain to the respective audio and servo signals, which gain can be adjusted by respective potentiometers 17 and 18. The output of operational amplifier 14 is fed to a full wave rectification stage 15 comprising operational amplifiers 21 and 22, and the output of operational amplifier 16 is fed to a full wave rectification stage 37 comprising operational amplifiers 30 and 32. The outputs of operational amplifiers 21, 22, 30 and 32 are coupled to respective diode pairs 24, 26; 28, 29; 34, 36; 38 and 39. As indicated in FIG. 2A, the output of operational amplifier 14 is coupled to the non-inverting input of operational amplifier 21 and the inverting input of operational amplifier 22. Similarly, the output of operational amplifier 16 is coupled to the non-inverting input of amplifier 30 and the inverting input of amplifier 32. As is evident, operational amplifier 21, in conjunction with its associated diodes, performs a precision half wave rectification function, allowing positive going portions of the output signal from operational amplifier 14 to be supplied to point 40. Operational amplifier 22, in conjunction with its diodes 28 and 29, performs a precision half wave rectification of negative going portions of the signal from operational amplifier 14 and supplies rectified signals to point 40. Accordingly, a full wave rectified version of the signal from operational amplifier 14 exists at point 40 in the circuit shown in FIG. 2A. Essentially, this signal is a d.c. signal corresponding to the input audio signal. Precision rectification preferably is performed due to the low level of the audio signals being rectified, which generally is below typical semiconductor diode threshold levels.

Similarly, operational amplifier 30, in conjunction with its diodes 34 and 36, performs a precision half wave rectification of positive going portions of the servo control signal from the output of operational amplifier 16 and operational amplifier 32, in conjunction with its diodes 38 and 39, performs a precision half wave rectification of negative going portions of the servo control signal from operational amplifier 16. Accordingly, a full wave rectified version of the servo control signal exists at point 42. Again, precision rectification is provided due to the low level of the servo control signals.

Accordingly, a signal is developed at point 43 of the voltage divider comprising resistors 44 and 46 proportional to the difference between the signals developed at points 40 and 42. If signals at points 40 and 42 are equal, and resistors 44 and 46 are the same value, a signal equal to the audio and servo signals at points 40 and 42 will be developed at point 43. When the audio and servo signals are unequal, then a voltage is developed at point 43 proportional to the error between the two signals. The error signal is fed to the inverting input of a comparator circuit comprising an operational amplifier 52. The noninverting input of operational amplifier 52 is coupled to a potentiometer 54 which is used in setting the reference or offset voltage for the comparator. In the illustrated embodiment, a supply voltage of 15 volts is used, and a voltage approximately equal to 7.5 volts or one-half the supply voltage is fed to the noninverting input of comparator 52. Comparator 52 thus compares the voltage at point 43 with the reference voltage and provides a control signal to voltage controlled amplifier 80. Due to feedback resistor 53, comparator 52 is provided with voltage gain, and thus voltages at point 43 of considerably lower signal level can be compared with the reference voltage.

Voltage controlled amplifier 80 includes an integrating stage 82, comprising resistor 84 and capacitor 86. The output of integrating stage 82 is coupled to the bias control input of a transconductance operational amplifier 88a, which may comprise a signetics type NE 570. Audio input 10 is fed directly to the inverting input of operational amplifier 88a. The noninverting input is coupled via potentiometers 83 to the + supply voltage. The output of transconductance amplifier 88a is coupled through resistor 89 to the inverting input of operational amplifier 87, the output of which is coupled to the input of amplifier 90 via a coupling capacitor 91.

Voltage controlled amplifier 80 operates as follows. The gain of transconductance amplifier 88a is changed by the signal at its bias input, i.e., by the control signal from comparator 52. The amplification provided to the audio signal is, accordingly, changed by the level of the control signal. Operational amplifier 87 provides additional gain, as determined by feedback resistor 85. Potentiometers 83 are provided to null out d.c. transients, for example the "thump" which is generated when the transconductance amplifier 88a changes gain levels and also to null out harmonic distortion.

Integrating stage 82 performs a bandwidth control function in the disclosed amplifier arrangement. Capacitor 86 charges and discharges through resistor 84 and comparator 52. The frequency range of operation of the disclosed amplifier arrangement is determined by the selection of capacitor 86. For example, for frequencies in the range of 20 Hz to 1000 kHz, capacitor 86 should be chosen as approximately 2.2 uf and resistor 84 at 8.2K ohms. For frequencies in the range 1 kHz to 20 kHz, capacitor 86 should be chosen as 0.5 uf and resistor 84 at 8.2k ohms. For operation at frequencies below 40 Hz, capacitor 86 must be chosen so that low frequency fluctuations at the output of comparator 52 are filtered and do not appear at the bias input of transconductance amplifier 88a. In this way, low frequency fluctuations at the control input of amplifier 88a are prevented from appearing in the audio output signal.

In operation, the error signal from comparator 52 is coupled to the bias input of transconductance amplifier 88a. The audio signal is coupled to the inverting input of transconductance amplifier 88a. The output of transconductance amplifier 88a is coupled to operational amplifier 87. Accordingly, a voltage controlled amplifier is provided, the gain of which is controlled by the voltage at the bias input of transconductance amplifier 88a. The output of the voltage controlled amplifier, i.e. the output of operational amplifier 87, is coupled via a resistor and coupling capacitor 91 to the inverting input of operational amplifier 92, whose output is coupled via a resistor 93 to ground. The positive and negative supply voltage buses 95 and 96, respectively, coupled to the operational amplifier 92, are arranged such that the output signal from operational amplifier 92 is modulated on the supply voltage buses. Transistors 97 and 98 perform series power supply regulation functions, and the respective positive and negative going portions of the audio output signals may be picked off at the respective points 99 and 100, coupled through diodes to the collectors of the respective transistors 97 and 98. Zener diodes 101 and 102 serve as means for providing reference voltages to the bases of the respective regulator transistors 97 and 98.

The positive and negative going portions of the audio output signal are coupled to driver transistors 103 and 105, respectively. The positive and negative going portions of the audio signal are then coupled via points B and C, respectively, to the similarly designated points B and C in FIG. 2B. Positive supply voltage is fed to point A in FIG. 2A and negative supply voltage is fed to point D in FIG. 2A from the corresponding points in FIG. 2B. Transistors 107, 108, and 109, 110 serve as driver transistors for the power amplifier stage 112, which in the illustrated embodiment comprises a number of parallel connected power transistors 114 and 116. Audio amplifier 90, as known to those skilled in the art, is of the quasi-complementary design. The output signal from power amplifier stage 112 is obtained at point 118, and is coupled to loudspeaker 130.

Audio amplifier 90 also comprises a bias stage 106, which is provided for adjusting the level of bias current through driver transistors 103 and 105.

Figure 2C:
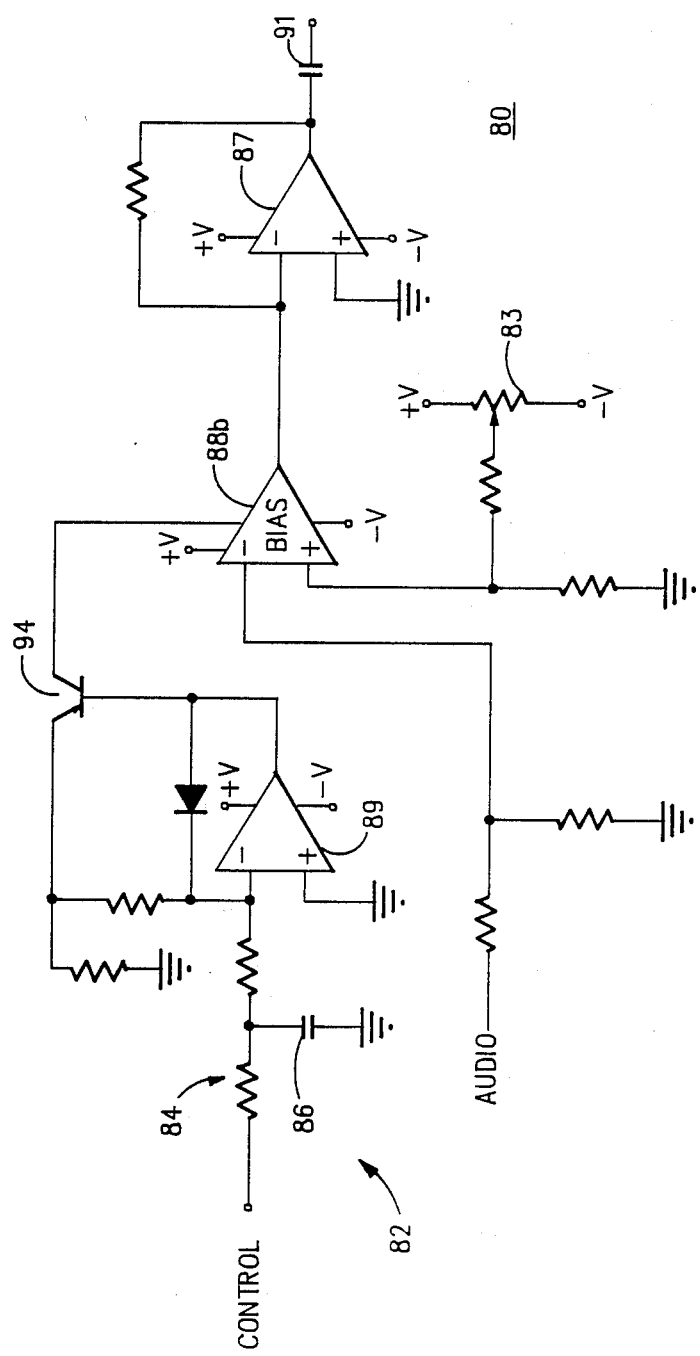
FIG. 2C is a schematic diagram of an alternative embodiment of a part of the circuit of FIG. 2A.

FIG. 2C shows an alternative arrangement of voltage controlled amplifier 80 using an LM 3080 amplifier manufactured by National Semiconductor. In this embodiment, input audio again is fed to the inverting input of amplifier 88b. The input audio signal is maintained within a specified range so as not to overload amplifier 88b. The output of amplifier 88b is coupled to operational amplifier 87 which provides additional voltage gain to the output signal from amplifier 88b. The error signal from comparator 52 is coupled through integrating stage 82 to an additional stage of amplification provided by operational amplifier 89. The output of amplifier 89 which is a voltage signal, is converted to a current signal by transistor 94 and coupled to the bias input of amplifier 88b.

FIGS. 3A and 3B show the arrangement of accelerometer 132 for providing the servo control signal proportional to the acceleration of the voice coil of output transducer 130. The accelerometer may comprise a piezo crystal 300, for example, a type G1195 manufactured by Piezo-Electric Products, mounted with suitable adhesive to a printed circuit board 310 or an aluminum block which is in turn coupled to a mounting flange 315, which may comprise a block of aluminum. Mounting flange 315 is, in turn, coupled to loudspeaker voice coil 320 with suitable adhesive. The sensor is mounted to the voice coil 320 after removing the loudspeaker voice coil dust cap 330. Leads 340 from the crystal 300 are routed through the speaker diaphragm 350 by suitably cementing to the diaphragm at 360. The leads are brought out to terminals 370 disposed on the speaker housing. In FIG. 3A, the loudspeaker magnet is shown at 380 and the pole pieces at 382 and 384. Leads from voice coil 320 are routed as shown at 390 to terminals 395.

For proper loudspeaker operation, the voice coil 320 windings must remain in the maximum magnetic flux concentration at all power levels.

FIGS. 4 and 5 show graphs of the output response of a Turbosound TSW-124 horn-loaded subwoofer driven by, respectively, a conventional amplifier and the servo-controlled amplifier according to the present invention. The frequency range plotted is from approximately d.c. to approximately 125 Hz. As a comparison of the two graphs shows, the low frequency response is extended and the resonant nulls in the response curve shown in FIG. 4 have been reduced, resulting in a flattening of the response, as shown in FIG. 5. Sonic improvements include lower apparent distortion due to cone mass and system resonance and higher overall output due to a reduction in null losses and increased low end output.

Components which may be used to construct the servo-controlled amplifier described in detail above are as follows:

| Reference Number | Component |
| --- | --- |
| 14, 16, 52, 87, 89, 92 | TLO-71 (Texas Instruments) |
| 20, 22, 30, 32 | TLO-72 (Texas Instruments) |
| 88a | NE570 (Signetics) |
| 88b | LM3080 (National Semiconductor) |

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded as illustrative rather than in a restricted sense.

What is claimed is:

1. An amplifier arrangement for reducing nonlinearities in the response of an output transducer coupled to the amplifier arrangement comprising:
   sensor means adapted to be coupled to a moving member of the output transducer, for providing a signal related to the movement of the moving member;
   first means, having as inputs a first signal to be coupled to the transducer after amplification and an output signal of the sensor means for rectifying said first signal and said output signal from the sensor means such that a rectified first signal and a rectified sensor output signal are generated which follow, respectively, said first signal and said sensor output signal at substantially the instantaneous frequencies in said first signal and said sensor output signal and further comprising means for comparing said rectified first signal and the rectified sensor output signal and for producing an error signal proportional to the difference between said rectified first signal and said rectified output signal of the sensor means; and
   amplifier means for amplifying said first signal having said first signal as an input and further having a control input coupled to receive said error signal from said first means, the gain of said amplifier means being controlled by said error signal.

2. The amplifier arrangement recited in claim 1, wherein said amplifier means comprises voltage controlled preamplifier means having said error signal as an input for controlling the gain of said preamplifier means, and power amplifier means coupled to an output of said preamplifier means.

3. The amplifier arrangement recited in claim 1, wherein said first means comprises full wave rectifier means for producing full wave rectified versions of said first signal and said signal from said sensor means.

4. The amplifier arrangement recited in claim 3, wherein said rectifier means comprises precision rectifier means including operational amplifier means.

5. The amplifier arrangement recited in claim 3, wherein said first means comprises comparator means coupled to an output of said full wave rectifier means.

6. The amplifier arrangement recited in claim 5 wherein said comparator means has gain, thereby amplifying said error signal.

7. The amplifier arrangement recited in claim 2 wherein said preamplifier means comprises transconductance amplifier means.

8. The amplifier arrangement recited in claim 7, further comprising further amplifier means coupled to an output of said transconductance amplifier means.

9. The amplifier arrangement recited in claim 8, wherein said further amplifier means comprises feedback resistor means coupled between an output and an input of said further amplifier means.

10. The amplifier arrangement recited in claim 1, wherein said sensor means comprises accelerometer means for generating a signal proportional to the acceleration of said moving member.

11. The amplifier arrangement recited in claim 1 wherein said transducer means comprises loudspeaker means.

12. A method for reducing nonlinearities in the response of an output transducer coupled to an amplifier arrangement comprising the steps of:
   providing a sensor output signal related to the movement of a moving member of said output transducer with sensor means adapted to be coupled to the moving member;
   rectifying a first signal to be coupled to the output transducer after amplification and said sensor output signal related to the movement of the output transducer such that a rectified first signal and a rectified sensor output signal are generated which follow, respectively, said first signal and said sensor output signal at substantially the instantaneous frequencies in said first signal and said sensor output signal;
   comparing said rectified first signal with said rectified sensor output signal related to the movement of the output transducer and producing an error signal proportional to the difference between said signals; and
   amplifying said first signal with amplifying means whose gain is controlled by said error signal.

13. The method recited in claim 12, wherein said steps of comparing and producing comprises generating full wave rectified versions of said first signal and said signal related to the movement of said transducer and generating a signal proportional to the difference between said two rectified signals.

14. An amplifier arrangement for reducing nonlinearities in the response of an output transducer coupled to the amplifier arrangement comprising:
   first means, having as inputs a first signal to be coupled to the output transducer after amplification and adapted to receive an output signal of sensor means adapted to be coupled to a moving member of the output transducer, the sensor means providing a signal related to the movement of the moving member, said first means comprising means for rectifying said first signal and said output signal of the sensor means such that a rectified first signal and a rectified sensor output signal are generated which follow, respectively, said first signal and said sensor output signal at substantially the instantaneous frequencies in said first signal and said sensor output signal and further comprising means for comparing said rectified first signal and the rectified sensor output signal and producing an error signal proportional to the difference between said rectified first signal and said rectified output signal of the sensor means; and
   amplifier means for amplifying said first signal having said first signal as an input and further having a control input coupled to receive said error signal from said first means, the gain of said amplifier means being controlled by said error signal.

15. The amplifier arrangement recited in claim 14, wherein said amplifier means comprises voltage controlled preamplifier means having said error signal as an input for controlling the gain of said preamplifier means, and power amplifier means coupled to an output of said preamplifier means.

16. The amplifier arrangement recited in claim 14, wherein said first means comprises full wave rectifier means for producing full wave rectified versions of said first signal and said signal from said sensor means.

17. The amplifier arrangement recited in claim 16, wherein said rectifier mans comprises precision rectifier means including operational amplifier means.

18. The amplifier arrangement recited in claim 16, wherein said first means comprises comparator means coupled to an output of said full wave rectifier means.

19. The amplifier arrangement recited in claim 18 wherein said comparator means has gain, thereby amplifying said error signal.

20. The amplifier arrangement recited in claim 15 wherein said preamplifier means comprises transconductance amplifier means.

21. The amplifier arrangement recited in claim 20, further comprising further amplifier means coupled to an output of said transconductance amplifier means.

22. The amplifier arrangement recited in claim 21, wherein said further amplifier means comprises feedback resistor means coupled between an output and an input of said further amplifier means.

23. The amplifier arrangement recited in claim 14, wherein said sensor means comprises accelerometer means for generating a signal proportional to the acceleration of said moving member.

24. The amplifier arrangement recited in claim 14 wherein said transducer means comprises loudspeaker means.

* * * * *